United States Patent
Feurle et al.

(10) Patent No.: US 6,639,825 B2
(45) Date of Patent: Oct. 28, 2003

(54) DATA MEMORY

(75) Inventors: Robert Feurle, Neubiberg (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/171,668

(22) Filed: Jun. 14, 2002

(65) Prior Publication Data

US 2002/0167832 A1 Nov. 14, 2002

Related U.S. Application Data

(63) Continuation of application No. PCT/EP00/11453, filed on Nov. 18, 2000.

(30) Foreign Application Priority Data

Dec. 14, 1999 (DE) .......................................... 199 60 247

(51) Int. Cl.[7] ................................................. G11C 7/00
(52) U.S. Cl. ....................... 365/149; 365/117; 365/114; 365/145; 365/102; 365/185.01; 365/185.2; 365/185.03
(58) Field of Search .......................... 365/185.01, 185.2, 365/185.03, 114, 115, 117, 145, 102, 149

(56) References Cited

U.S. PATENT DOCUMENTS 3,996,483 A * 12/1976 Lombard ..................... 327/37
5,623,442 A    4/1997 Gotou et al.
5,706,225 A    1/1998 Buchenrieder et al.
6,118,699 A *  9/2000 Tatsumi et al. ........ 365/185.18
2002/0027803 A1 * 3/2002 Matsui ....................... 365/173

FOREIGN PATENT DOCUMENTS

EP    0 140 235 A2    5/1985
EP    0 152 584 B1    8/1985

* cited by examiner

Primary Examiner—Viet Q. Nguyen
(74) Attorney, Agent, or Firm—Laurence A. Greenberg; Werner H. Stemer; Gregory L. Mayback

(57) ABSTRACT

The data memory device has a plurality of memory cells for storing data which are represented by a first physical value of the storing memory elements, especially their conductivity or charge. The memory elements are, for example, storage capacitors. A detection device detects the first physical value representing the data and a second detection device is provided for detecting a second physical value of the storage cells or constituents of the same, especially of the storage element, especially the leakage current of the storage capacitor provided for storing the data. The second physical value represents a second detectable item of information in addition to the first physical value representing the data, independently of the first physical value. The invention also relates to a method for permanently storing information in storage cells of a data storage device for reversibly or permanently storing data.

20 Claims, 1 Drawing Sheet

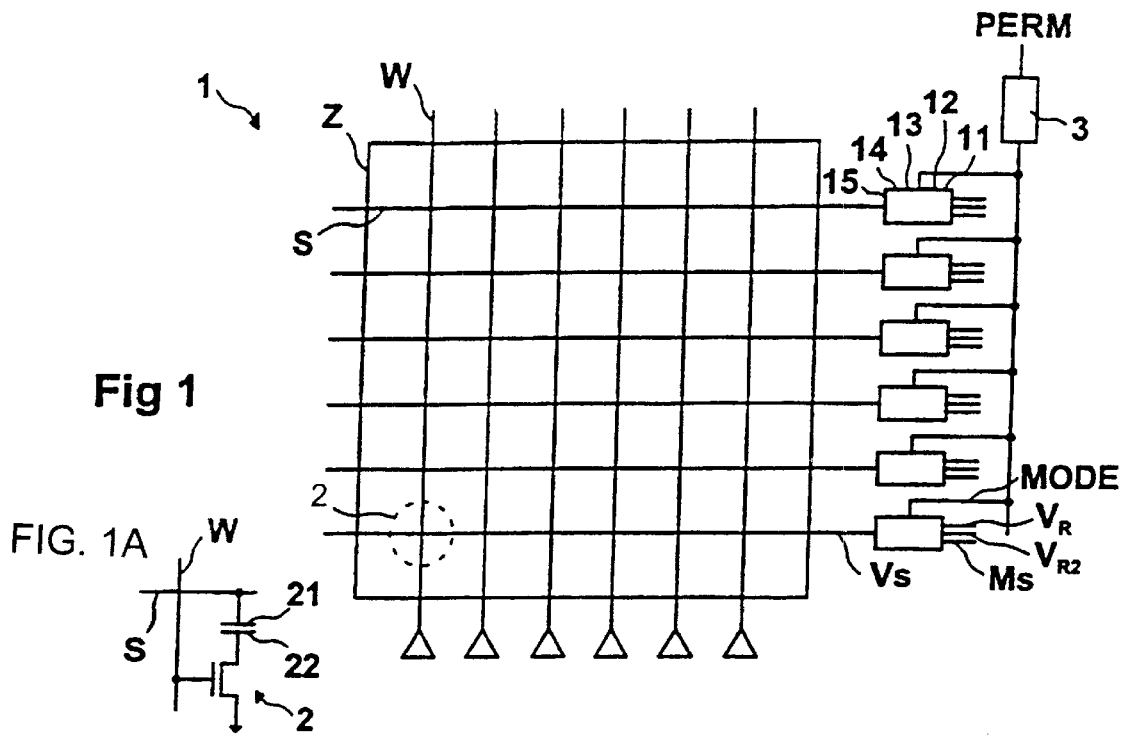
Fig 1
FIG. 1A
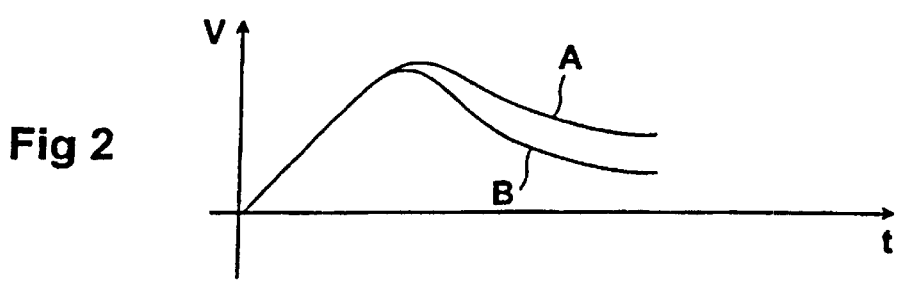
Fig 2
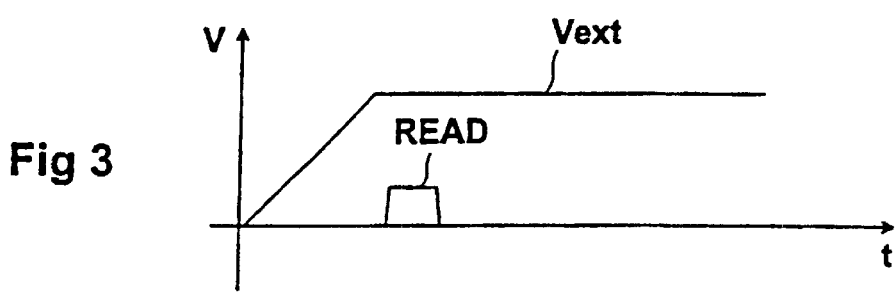
Fig 3

DATA MEMORY

CROSS-REFERENCE TO RELATED APPLICATION

This application is a continuation of copending International Application No. PCT/EP00/11453, filed Nov. 18, 2000, which designated the United States and which was not published in English.

BACKGROUND OF THE INVENTION

Field of the Invention

The invention relates to a data memory having a multiplicity of memory cells for storing data represented by a first physical variable, particularly by the conductivity or the charge, for the storing storage elements, particularly in the form of storage capacitors, in the memory cells. A detection device is provided to detect the first physical variable representing the data. The invention also pertains to a method for permanently storing information in memory cells in a data memory for reversibly or permanently storing data.

In semiconductor memories, particularly DRAM semiconductor memories (dynamic RAMs), memories whose storage capacity is lower than that of the memory cell arrays are required for permanently storing the "redundancy information". These permanent memories are growing in terms of their required capacity and hence in terms of their space requirement on the memory chip as the memory cell arrays for reversibly storing data become larger and larger. In this context, separate drive and evaluation circuits are necessary for the permanent memories, which occupy further valuable space on the semiconductor chips. An alternative to the additional permanent memories would be worthwhile in order to be able to use the space thus gained for the memory cell array, and hence to increase the storage capacity.

SUMMARY OF THE INVENTION

It is accordingly an object of the invention to provide a data memory and method, which overcomes the above-mentioned disadvantages of the heretofore-known devices and methods of this general type and which provides for a data memory wherein the storage capacity is increased without increasing the number of memory cells.

With the foregoing and other objects in view there is provided, in accordance with the invention, a data memory, comprising:

a multiplicity of memory cells for storing data represented by a first physical variable and for storing a detectable information item represented by a second physical variable;

a first detection device connected to the memory cells and configured to detect the first physical variable representing the data;

a second detection device connected to the memory cells and configured to detect the second physical variable representing the second detectable information item independently of the data represented by the first physical variable;

wherein the first physical variable is a conductivity associated with a respective memory cell, and the second physical variable is a discharging or charging time associated with a respective memory cell.

In accordance with an added feature of the invention, the memory cells each include a storage element and the first physical variable is the conductivity of the storage element and the second physical variable is the discharging or charging time of the storage element. In a preferred embodiment, the second detection device records the second physical variable for the memory cell as a measured value, assesses the measured value with reference to a predetermined threshold value, and delivers a measurement signal as a result thereof.

In other words, according to the invention, a second detection device is provided for detecting a second physical variable for the memory cells or parts thereof, particularly for the storage element, particularly the leakage current of the storage capacitor provided for storing the data, which second variable represents not only the first physical variable representing the data but also, independently thereof, a second detectable information item.

The invention proposes providing a conventionally designed memory, particularly a semiconductor memory of the random access type, with a second detection device which, particularly in the case of semiconductor memories containing storage capacitors in the individual memory cells of the memory cell array, uses a further, otherwise unevaluated physical variable for the storage elements in order to store data, without adversely affecting the storage capabilities for the data in the memory cells. The effect achieved by this is multiple use of the storage capacity of a memory cell; the maximum volume of information which can be stored in the data memory, that is to say information and data together, is significantly increased, at best even multiplied. In DRAM semiconductor memories customary today, it would thus be a simple matter to dispense with the fuse array required for storing the redundancy information, the fuse array being made up from permanently programmable memory cells, in contrast to the reversibly programmable memory cell array. In addition, the proposed further development of data memories is possible without any great technological changes in the layout or in the design of the memory cells, particularly in the case of semiconductor memories of the random access type. This means that it is possible to use existing structures without added technological complexity, and hence to implement the invention in existing concepts quickly and cheaply. Novel data memories for storing a greater maximum possible volume of data or information than previously are now technically possible.

In one advantageous and therefore particularly preferred refinement of the invention, the second detection device records the second physical variable for the memory cell directly or dependently using a signal derived therefrom as a measured value and assesses the measured value in terms of its exceeding or falling short of at least one predetermined threshold value, and delivers a measurement signal as the result of the assessment. The proposed stipulation of a threshold value considerably simplifies determination of the storage state for the information. The adjustability of the detection threshold also permits variable settings, which means that the information can assume a plurality of values or states as a result of the threshold value being staggered.

In one preferred refinement of the invention, the second physical variable is the capacitance, the resistance, the impedance, the discharging or charging time, the charging constant, the leakage current, the direction or strength of magnetization for the memory cell or parts thereof, particularly for the storage element. This means that it is a particularly simple matter to store information in addition to the data in the individual memory cells without restricting the functionality of the memory cells in terms of reversible or permanent storage of the data.

A refinement of the invention which is likewise preferred provides for the first physical variable to be the conductivity, the charge, the direction of magnetization or the strength of magnetization for the memory cell or parts thereof, particularly for the storage element.

Advantageously, the memory cell is formed by an electric or ferroelectric memory cell of a memory of the random access type. Accordingly, the storage element is preferably formed by a storage capacitor. When a storage capacitor is used as storage element, the information can be impressed particularly simply by altering the capacitance of the storage capacitor, without affecting the storage capacitor's storage capability for the data represented by means of the charge.

In addition, the second physical variable is particularly advantageously the retention time or the charging and discharging constant or an associated physical variable, particularly the time-altered charging voltage, which can be tapped off, for the storage capacitor in the memory cell. This means that, in the case of information impressed using the capacitance, this information can be ascertained particularly easily by virtue of the proposed indirect determination of the storage capacitor's capacitance.

In accordance with another advantageous refinement of the invention, the data memory can be operated in two operating modes, where, in the first operating mode (normal mode), the memory cells are operated while detecting the first physical variable, and, in the second operating mode (permanent mode), the second physical variable for the memory cells is evaluated.

Another advantage is that the data memory can be operated in both operating modes at the same time. This makes it possible to store a considerably greater volume of data or information in such a data memory without changing between the operating modes externally.

For the purpose of permanently storing a second detectable information item, it is particularly advantageous and therefore preferred for the capacitance of the storage capacitor in the memory cell to be set to a predetermined reduced value.

It is likewise advantageous that the storage capacitor can have a write voltage applied to it in order to reduce its capacitance, the write voltage being higher than the voltages which need to be applied in order to detect or to impress the first physical variable representing the data. This can result in "impairment" of the storage capacitor's dielectric or even in breakdown in the dielectric, which causes a permanent reduction in the storage capacity and hence permanent programming or impression of the information. The retention time alteration following breakdown in a storage element, for example, allows the information to be established easily by assessing the memory cell's charge at a later time.

In line with a refinement of the invention which is no less advantageous, the storage capacitor is designed to be able to have heat applied to it in order to reduce its capacitance. This also means that impairment of the dielectric or reduction in the capacitance is associated with the aforementioned advantages.

One preferred variant of the invention proposes that the first and the second detection device be physically formed by a single detector device. Hence, besides dispensing with a memory cell array for storing the information, the area for the second detection device additionally becomes available, or the circuit is dispensed with.

In accordance with another refinement of the invention, in order to ascertain the storage state for the data and/or for the second detectable information item, the first and/or the second detection device or the detector device has a reference voltage applied to it.

Preferably, the detector device or the second detection device can have at least one second reference voltage applied to it in order to detect the storage element's charge, reduced particularly by the leakage current, which means that a plurality of different second detectable information items can be ascertained. This permits not only the two binary states 1 and 0 but also other states to be achieved, which significantly increases the storage capacity for the information.

In one particularly advantageous and hence preferred refinement, the first and/or the second detection device or the detector device is a sense amplifier associated with the memory cell. Use of the sense amplifiers, which are present anyway, means that only very few alterations to already existing data memory designs are required in order to permit the inventive storage of information; fast and inexpensive implementation is thus possible.

A changeover device is advantageously provided in order to allow changing between the operating modes (normal mode or permanent mode). Accordingly, the changeover device is controlled by a signal which can be applied to the data memory externally or by a signal which is derived from such a signal.

With the above and other objects in view there is also provided, in accordance with the invention, a data memory that comprises the following:

a multiplicity of memory cells having storage elements for storing data represented by a first physical variable;

a detection device connected for detecting the physical variable representing the data, the detection device being configured to ascertain a storage state using a first reference voltage;

the detection device being connected to receive a plurality of mutually different second reference voltages for detecting a second physical variable of the memory cells, the second physical variable representing, independently of the first physical variable, a second detectable information item or a second storage state, and wherein the different second reference voltages enable a plurality of different second detectable information items or second storage states to be detected.

In other words, in the other embodiment, there is provided a data memory which has a multiplicity of memory cells for storing data, where the data are represented by a first physical variable for the storing storage elements in the memory cells, for example conductivity or charge, particularly the voltage which can be tapped off on a storage capacitor provided as a storage element, with a detection device being provided for detecting the physical variable which represents the data, the detection device using a reference voltage to ascertain the storage state, where the detection device can have at least one second reference voltage applied to it for direct or dependent, signal-derived detection of a second physical variable for the memory cell or parts thereof, particularly for the storage element, particularly the leakage current of the storage capacitor provided for storing the data, where the second physical variable represents not only the first physical variable representing the data but also, independently thereof, a second detectable information item or a second storage state ascertained on the basis of the leakage current and the charging voltage and/or the second reference voltage.

One advantageous development provides for more than two reference voltages to be provided, which means that a plurality of different second detectable information items or second storage states can be detected. Again, this allows a higher data or information density or volume to be stored as compared with the binary system.

Preferably, the detection device is a sense amplifier associated with the memory cell. As a result of this, dispensing with novel structures frees the areas required for this, for example on a substrate holding the data memory.

There is also disclosed a method which can be summarized as follows: for the purpose of permanently storing information in memory cells in a data memory for reversible or permanent storage of data using a multiplicity of memory cells, where the data are represented by means of a first physical variable for the storing storage elements in the memory cells, particularly conductivity or charge, particularly the voltage which can be tapped off on a storage capacitor provided as a storage element in the memory cell, with a detection device being provided to detect the first physical variable representing the data, and with the physical properties of the memory cell being altered, in line with necessary permanent storage of the information, such that a second detectable physical variable becomes able to be determined, independently of the first physical variable detected for the purpose of determining the storage state for the data, by the detection device or another detector device.

In one advantageous refinement of the method, the second detectable physical variable is the capacitance of the memory cells or an associated physical variable, and the permanent information is impressed by altering the retention time of particular memory cells or storage elements. This allows the storage capacity of normal semiconductor memories to be increased in a simple manner.

In another advantageous and hence preferred refinement of the method, the detection device for detecting the first physical variable or the data or a second detection device for measuring the second physical variable is used, and the device has at least one reference voltage applied to it in order to determine the second physical variable.

Other features which are considered as characteristic for the invention are set forth in the appended claims.

Although the invention is illustrated and described herein as embodied in a data memory and method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic diagram of a preferred exemplary embodiment of a data memory in accordance with the invention;

FIG. 1A is a detail from FIG. 1, illustrating a memory cell of the invention;

FIG. 2 is a schematic illustration of the signal profiles for the charge stored in a storage capacitor, in accordance with the exemplary embodiment; and FIG. 3 is a graphical illustration of the signals over time for changing over the operating modes.

DESCRIPTION OF THE PREFERRED EMBODIMENTS

Referring now to the figures of the drawing in detail and first, particularly, to FIG. 1 thereof, there is shown a data memory 1 in accordance with the invention, having a memory cell array Z which comprises a multiplicity of memory cells 2. The memory cells 2 have associated word lines W and sense lines S, via which sense lines S the memory cells 2 are connected to their associated sense amplifiers 13. The sense amplifiers 13 each form a detector device for detecting the charge state of the cells 2.

In this context, the storage states representing the data are detected by evaluating the measured value VS tapped off via the sense lines. This operating mode corresponds to the known normal operation (normal mode) of the data memory. The measured value VS is determined by the charge state of the storage element 22, which is in the form of a storage capacitor 21, by virtue of its capacitor plates being connected in a known manner to the sense line S and via this line to the sense amplifier 13. The measured value VS is evaluated by the sense amplifier 13 to form the measurement signal MS in a known manner using a reference voltage VR applied to the sense amplifier.

The memory cells are used not just in a known manner to store reversible data using a first physical variable, for example the charge of a capacitance, but rather also to store further information independently of the storage of the data, using a second physical variable, for example the capacitance itself. The size of the capacitance, or the artificially impaired retention time, thus represents not only the first physical variable representing the data but also a separate second detectable information item. Corresponding application is also possible for permanent data memories or for other forms of reversible data memories.

In addition to these known properties of a semiconductor memory of the random access type, the sense amplifier 13 is used to determine not only the charge state of the storage capacitor 21, but also its storage capacity. To this end, another, second reference voltage VR2, which is different from the first reference voltage VR, is applied to the sense amplifier 13. The potential of the second reference voltage VR2, which potential is different than that of the first reference voltage VR, means that the storage states for memory cells 2 for which the storage capacity and/or leakage current of the storage capacitor 21 have/has been set to be lower, corresponding to permanent storage of the information, will result in a different assessment of the memory content. Owing to this second assessment, brought about as a result of the faster potential drop or the charging voltage for memory cells with a reduced capacitor capacitance and hence a higher leakage current, the value of the capacitance itself can be determined as the second detectable information item.

The opportunity to store information permanently in a data memory without adversely affecting the latter's storage properties for data makes it possible to dispense with independent permanent memories used to date which are needed in addition to the reversible memories in order to maintain the availability of redundancy information, for example. "Laser fuses", which are set externally using a laser beam and have been used to date as permanent information media, or "antifuse or fuse arrays" are now no longer required.

In this context, the second reference voltage VR2 is used, and hence the second detectable information item is detected, using a changeover signal MODE which is applied to the sense amplifiers 13 and is generated, using a changeover device 3, from a signal applied to the store externally, or generated therefrom, in order to enter the permanent mode PERM. The proposed refinements make it possible to dispense with the "fuse arrays" used to date (small permanent stores, with a lower storage capacity than the data memory) for permanently holding the redundancy information of a semiconductor memory.

The programming of the inventive information stores can negatively bias the substrate level, for example, without significantly burdening the other chip areas by biasing a common array electrode and selecting the addressed memory cell by means of row and column addresses, and can then apply a positive potential selectively in each case per cell.

FIG. 2 shows a schematic measured value A for a storage capacitor 21 whose capacitance has not been reduced, and a measured value B for a storage capacitor whose capacitance has been reduced. In the first case (A), the storage capacitor's voltage drops more slowly than in the second case, since in this case the reduced capacitance and/or the increased leakage current means that the charge was not as great or flows away more quickly.

With an appropriate choice of second reference voltage VR2, the storage state is now assessed as a logic zero for the signal profile B, with the storage state still being interpreted as a logic "one" for the signal profile A. The first reference voltage VR needs to be chosen such that the storage state is assessed as "one" for both signal profiles shown.

The introduction of a further reference voltage (not shown) makes it possible to permit other detectable stages and hence a plurality of values for the information item. This means that the information item can also have a higher density of data than permitted by the binary system. The second detectable information item becomes multistage, and thus can in this way assume a plurality of different storage states, i.e. the capacitances of the storage capacitors are reduced in a plurality of stages, or the second physical variable is set in stages.

In order to impress the permanent information, the retention time of the storage elements or capacitors 21 to be programmed is altered. As a result of this, the second detectable physical variable, the capacitance of the memory cells, is altered such that the detection described above becomes possible. The capacitance is best altered using heat treatment, for example by means of a current through the memory cell, or by means of "breakdown" in the dielectric using a voltage which is higher than is normally used, in order to "impair" the dielectric permanently. Applying a voltage to the capacitor would result in short, and hence desirable, programming durations, since under suitable voltage conditions the time before breakdown in the dielectric is very short (a few $\mu$sec). Such breakdown is also highly reliable, since breakdown in an insulator is irreversible. Another advantage is that the stores can also still be programmed after assembly (as in the case of the known antifuses).

Reading of the permanent information could be initiated by a signal train, as shown in FIG. 3. When the external supply voltage Vext has been applied, a special signal READ is applied to the data memory, from which the signal for entry into the permanent mode PERM and/or the changeover signal MODE is generated internally.

Hence, the permanent information would be read when the data memory is "powered up", but it is also conceivable for the permanent information to be able to be read during normal operation, since the retention times also remain detectable during normal operation (reading of the reversible data), for example using the charge drop without losing the reversible storage.

Should simultaneous operation of the data memory in both operating modes (permanent mode and normal mode) not be desirable, then the information which is read can be buffer-stored in, by way of example, a flip-flop or other areas of the data memory. By way of example, it is conceivable to use the detection circuit to store the information.

The proposed data memory allows a considerable increase in the storable data or volume of information using available known circuits (sense amplifiers) for state detection and storage elements (DRAM cells) for permanent storage. In the best case, the storage capacity of the known structures can be multiplied.

In this context, the novel technology has a low space requirement and high process compatibility, since, as already mentioned, no novel or complex structures need to be provided. A large part of the masks already available for producing the memory chips can continue to be used.

We claim:

1. A data memory, comprising:
    a multiplicity of memory cells for storing data represented by a first physical variable and for storing a detectable information item represented by a second physical variable;
    a first detection device connected to said memory cells and configured to detect the first physical variable representing the data;
    a second detection device connected to said memory cells and configured to detect the second physical variable representing the second detectable information item independently of the data represented by the first physical variable;
    wherein the first physical variable is a conductivity associated with a respective memory cell, and the second physical variable is a discharging or charging time associated with a respective memory cell.

2. The data memory according to claim 1, wherein said memory cells each include a storage element and the first physical variable is the conductivity of the storage element and the second physical variable is the discharging or charging time of the storage element.

3. The data memory according to claim 1, wherein said second detection device is configured to record the second physical variable for the memory cell as a measured value, to assess the measured value with reference to a predetermined threshold value, and to deliver a measurement signal as a result thereof.

4. The data memory according to claim 3, wherein said second detection device is configured to record the measured value directly or dependently using a signal derived therefrom.

5. The data memory according to claim 1, wherein said memory cells are cells selected from the group consisting of electric memory cells and ferroelectric memory cells of a random access memory.

6. The data memory according to claim 2, wherein said storage element is a storage capacitor.

7. The data memory according to claim 6, wherein the second physical variable is a charging and discharging constant of said storage capacitor.

8. The data memory according to claim 6, wherein the second physical variable is a physical variable associated with a charging and discharging constant of said storage capacitor.

9. The data memory according to claim 6, wherein the second physical variable is a time-altered charging voltage of said storage capacitor.

10. The data memory according to claim 1, which comprises a first operating mode in which said memory cells are operated while detecting the first physical variable, and a second operating mode in which the second physical variable for said memory cells is evaluated.

11. The data memory according to claim 10, wherein the data memory can be operated simultaneously in said first and second operating modes.

12. The data memory according to claim 6, wherein the second detectable information item is permanently stored by setting a capacitance of said storage capacitor in a respective said memory cell to a predetermined reduced value.

13. The data memory according to claim 12, wherein the capacitance of said storage capacitor is reduced by applying a write voltage thereto that is higher than a write voltage regularly required for detecting or impressing the first physical variable representing the data.

14. The data memory according to claim 12, wherein the capacitance of said storage capacitor is reduced by heating said storage capacitor.

15. The data memory according to claim 1, wherein said first detection device and said second detection device are physically embodied in a single detection unit.

16. The data memory according to claim 1, wherein one of said first detection device, said second detection device, and said single detection unit has a reference voltage applied thereto in order to ascertain the memory state for one of the data and the second detectable information item.

17. The data memory according to claim 1, wherein at least one of said first detection device, said second detection device, and said single detection unit is a sense amplifier associated with the memory cell.

18. The data memory according to claim 10, which comprises a changeover device for changing between the first and second operating modes.

19. The data memory according to claim 18, wherein said changeover device has a control input for receiving a control signal.

20. The data memory according to claim 19, wherein the control signal is a signal externally applied to the data memory or a signal derived therefrom.

* * * * *